United States Patent [19]

Saitoh et al.

[11] Patent Number: 4,834,023
[45] Date of Patent: May 30, 1989

[54] APPARATUS FOR FORMING DEPOSITED FILM

[75] Inventors: Keishi Saitoh, Nabari; Masaaki Hirooka, Toride; Jun-Ichi Hanna; Isamu Shimizu, both of Yokohama, all of Japan

[73] Assignee: Canon Kabushiki Kaisha, Tokyo, Japan

[21] Appl. No.: 943,437

[22] Filed: Dec. 19, 1986

[51] Int. Cl.$^4$ .................................. C23C 16/00
[52] U.S. Cl. ........................... 118/730; 118/715
[58] Field of Search ........................ 118/715, 730

[56] References Cited

U.S. PATENT DOCUMENTS

| | | | |
|---|---|---|---|
| Re. 31,708 | 10/1984 | Gordon | 427/126.2 |
| 2,552,626 | 5/1951 | Fisher et al. | 201/64 |
| 3,083,550 | 4/1963 | Auerbach | 65/3 |
| 3,088,850 | 5/1963 | Brichard | 118/715 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 148/175 |
| 3,224,912 | 12/1965 | Ruehrwein | 148/175 |
| 3,306,768 | 2/1967 | Peterson | 117/106 |
| 3,466,191 | 9/1969 | Stinchfield et al. | 117/213 |
| 3,506,556 | 4/1970 | Illery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 |
| 3,870,558 | 3/1975 | Shimizu et al. | 117/201 |
| 3,984,587 | 10/1976 | Lipp | 427/70 |
| 4,058,430 | 11/1977 | Suntola et al. | 156/611 |
| 4,096,822 | 6/1978 | Yamawaki | 118/500 |
| 4,146,657 | 3/1979 | Gordon | 427/126 |
| 4,180,596 | 12/1979 | Crowder et al. | 427/42 |
| 4,206,252 | 6/1980 | Gordon | 427/160 |
| 4,239,811 | 12/1980 | Kemlage | 427/95 |
| 4,262,631 | 4/1981 | Kubacki | 118/723 |
| 4,282,267 | 8/1981 | Kuyel | 427/38 |
| 4,328,261 | 5/1982 | Heinecke et al. | 427/91 |
| 4,357,179 | 11/1982 | Adams et al. | 148/1.5 |
| 4,359,490 | 11/1982 | Lehrer | 427/95 |
| 4,402,762 | 9/1983 | John et al. | 148/1.5 |
| 4,416,217 | 11/1983 | Nakamura et al. | 118/696 |
| 4,422,407 | 12/1983 | Bessot | 118/723 |
| 4,448,801 | 5/1984 | Fukuda et al. | 427/39 |
| 4,501,766 | 2/1985 | Suzuki | 427/38 |
| 4,515,107 | 5/1985 | Fournier et al. | 118/718 |
| 4,522,663 | 6/1985 | Ovshinsky et al. | 148/403 |
| 4,526,809 | 7/1985 | Hall et al. | 427/74 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,637,938 | 1/1987 | Lee et al. | 427/53.1 |
| 4,650,539 | 3/1987 | Irvine et al. | 156/613 |
| 4,652,463 | 3/1987 | Peters | 427/53.1 |
| 4,657,777 | 4/1987 | Hirooka | 427/39 |
| 4,664,937 | 5/1987 | Ovshinsky | 427/39 |

FOREIGN PATENT DOCUMENTS 2038086A 7/1980 United Kingdom .
2148328 5/1985 United Kingdom .

Primary Examiner—Richard Bueker
Attorney, Agent, or Firm—Fitzpatrick, Cella, Harper & Scinto

[57] ABSTRACT

An apparatus for forming a deposited film by bringing gaseous starting materials for forming deposited film contact with a gaseous halogenic oxidizing agent which exerts oxidative effect on the starting materials, comprises, in a chamber for forming the deposited film, gas discharge means comprised of a gas discharge pipe for discharging the gaseous starting materials and a gas discharge pipe for discharging the halogenic oxidizing agent and means for disposing supports on which a plurality of cylindrical supports for depositing the film thereon are arranged around the gas discharge means.

5 Claims, 5 Drawing Sheets

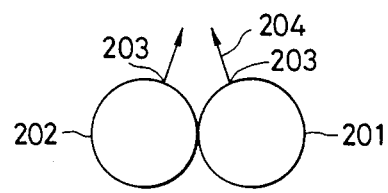
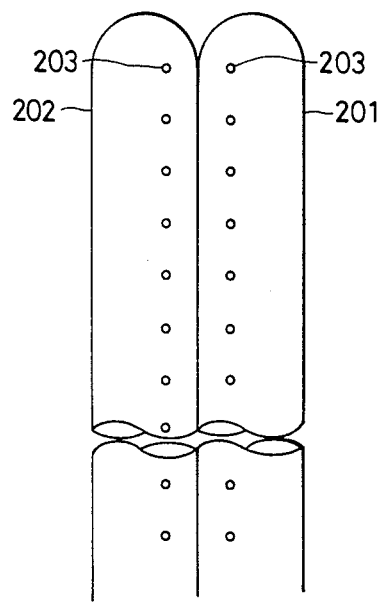

APPARATUS FOR FORMING DEPOSITED FILM

BACKGROUND OF THE INVENTION

1. Field of the Invention

The present invention relates to an apparatus for manufacturing functional films and more specifically the present invention pertains to an apparatus for manufacturing functional films, in particular, semiconductor deposited films effectively applicable to electronic devices such as semiconductor devices, photosensitive devices for electrophotography, light input sensor devices for electrophotography, light input sensor devices for an optical image input apparatus.

2. Related Background Art

Plasma CVD (Chemical Vapor Deposition) technique has been put to practical use as a film forming method for photosensitive devices for electrophotography.

The plasma CVD technique generally comprises reducing the internal pressure of a reaction chamber to a high vacuum, feeding starting gases into the reaction chamber and then decomposing the starting gases with glow discharge to deposit a thin film on a substrate disposed in the reaction chamber.

This method is a method for forming films which makes it possible to provide an amorphous silicon film, from a silane gas such as $SiH_4$, $Si_2H_6$ used as the starting gas, having relatively density low of localized level which is present in the forbidden band of the amorphous silicon, to carry but the valence control by the doping of a substitutional impurity and to provide photosensitive material for electrophotography having excellent properties.

Referring to FIG. 6, there is shown an essential construction of the principal part of a preferred embodiment of the conventional vacuum film-forming apparatus according to plasma CVD technique, capable of mass production. The practical operations for forming films on the surface of a cylindrical support will hereunder be explained concretely according to the conventional film-forming apparatus.

The reference numeral 611 is assigned to an intake chamber (a stage for disposing substrates for disposing a cylindrical support 641 at predetermined position and one or a plurality of the cylindrical supports 641 are fixed to a fixation member 616 for after opening a cover 615.

The cover 615 is shut, the pressure in the intake chamber 611 is reduced to a desired value by an exhaust system 631, while heating the cylindrical support 641 to, for instance, the extent of from 200° to 300° C. by a heater 624 for heating the supports. After the temperature is sufficiently stabilized, the cylindrical support 641 is transported by a transporting means 617 to a relay chamber (a relay stage) 612 maintained at a desired degree of vacuum by an exhaust system 642, while opening an intermediate gate valve 619. The gate valve 619 is shut after transferring the support, the same number of gate valves 29 as that of the supports 641 are opened, the cylindrical supports 641 is moved downward by an elevating means 618 and thus each cylindrical support 641 is transferred to a plurality of reaction furnaces 614-1, 614-2, (film-forming stages) disposed corresponding each gate valve.

The elevating means 618 is brought back to its original position after fixing each cylindrical support 641 to each corresponding rotatable member 627 for receiving the cylindrical support by a driving means 637.

After shutting each gate 629, the internal pressure of the reaction furnaces 614-1, 614-2 are suitably adjusted according to need, by an exhaust system 632 for the reaction furnaces 614-1, 614-2 and a gas introducing system 634 for introducing a starting gas for forming films, such as silane, then a high-frequency voltage is applied to the supports and coaxial cylindrical electrodes 626 by a high-frequency power supply 633 to cause discharge in the reaction furnaces 614-1, 614-2. The starting gas such as silane introduced through a starting gas introducing system 634 is decomposed due to the discharge and a film such as an amorphous silicon film is formed on the surface of the cylindrical supports 641. During the film-forming procedure, the cylindrical supports 641 are internally heated by heaters 628 and rotated by the driving means 637 to assure the uniformity in the thickness of the film. Plasma generated due to the discharge are confined within a predetermined space of the reaction furnaces 614-1, 614-2 with electric shielding 625.

After completing the film-forming process, the introduction of the starting gas is stopped, simultaneously the high-frequency power supply is turned off, then the gate valve 629 is opened and each of the cylindrical support 641 the surface of which is covered with the deposited film is pulled up to the relay chamber 612 by the elevating means 618 before the gate valves 629 are closed. Then, the gate valve 620 is opened and each cylindrical support 641 on which the deposited film is formed is transferred to a chamber 613 for withdrawing (a stage for removing the supports) the pressure of which is previously reduced to a predetermined value, with a transporting means 621. After finishing the transportation, the gate valve 620 is again closed. The temperature of the cylindrical supports 641 transferred to the chamber 613 for withdrawing the same is reduced to a predetermined valve, while maintaining a predetermined reduced pressure, by the cooling effect of a cooling plate 623 which is cooled by a cooling means 636. Thereafter, a leak valve 639 is opened gradually so as not to exert a detrimental influence on the film formed to cause the communication between the chamber 613 for withdrawal and the external air and then a cover 622 for withdrawal is opened to remove the cylindrical supports 641, on which the deposited film is formed, outside the chamber.

In the conventional method for forming deposited films, these processes for manufacturing films as those explained above are continuously repeated to form films on many substrates.

As described above it is required, in the conventional plasma CVD techniques, that a high-frequency electric power should be applied to a cylindrical substrate and a coaxial cylindrical electrode within a reaction chamber so as to make electrical characteristics and thickness of a deposited film obtained according to the technique more uniform.

For that reason, it is difficult to form deposited films on two or more cylindrical substrates in a reaction chamber simultaneously. This is an obstacle to improve the productivity of the deposited film.

Moreover, only a part of the starting gas was deposited on a desired cylindrical substrate since, in the plasma CVD technique, a cylindrical substrate and a coaxial cylindrical electrode must be disposed in a reaction chamber and the deposited film is formed on both of the cylindrical substrate and coaxial cylindrical electrode in the same thickness. Consequently, the plasma CVD technique has problems such that the degree of utilization of the starting gas is low and that the price of the resulting deposited film becomes expensive.

In addition, according to the plasma CVD technique, a starting gas is decomposed with a high-frequency energy applied thereto externally and deposited on a substrate and therefore there are problems such that it is difficult to effectively introduce the high-frequency energy into a reaction chamber and that the cost of the apparatus becomes expensive.

SUMMARY OF THE INVENTION

The principal object of that invention is to eliminate the disadvantages of the conventional apparatus for forming deposited films as explained above as well as to provide an apparatus in which a novel method for forming deposited films irrespective of conventional method therefor is utilized.

Another object of this invention is to provide an apparatus for forming deposited film which makes it possible to save energy consumption, which permits an easy control of the quality of the resultant films and which can provide deposited films having a uniform characteristics over a large area.

A further object of this invention is to provide an apparatus for forming deposited films excellent in productivity and mass productivity and capable of easily providing a deposited film having a high quality and physical properties such as electrical, optical and semiconductor properties.

Still another object of this invention is to provide an apparatus for forming a deposited films by bringing gaseous starting materials for forming deposited film contact with a gaseous halogenic oxidizing agent which exerts oxidative effect on the starting materials, which comprises, in a chamber for forming the deposited film, gas discharge means comprised of a gas discharge pipe for discharging the gaseous starting materials and a gas discharge pipe for discharging the halogenic oxidizing agent and means for disposing supports on which a plurality of cylindrical supports for depositing the film thereon are arranged around the gas discharge means.

BRIEF DESCRIPTION OF THE DRAWINGS

FIGS. 2A and 2B are a schematic diagram illustrating the gas discharge pipe of the apparatus according to the present invention respectively;

DESCRIPTION OF THE PREFERRED EMBODIMENTS

The present invention is based on that a deposited film can be obtained by introducing a gaseous starting material for forming a deposited film and a gaseous halogenic oxidizing agent which exerts oxidative effect on the starting material into a reaction space and then bringing into contact with each other chemically to form precursors under excited state and forming a deposited film on a substrate disposed within a film-forming space with using the precursors as the feeding source of constituents for the deposited film.

Figure 1:
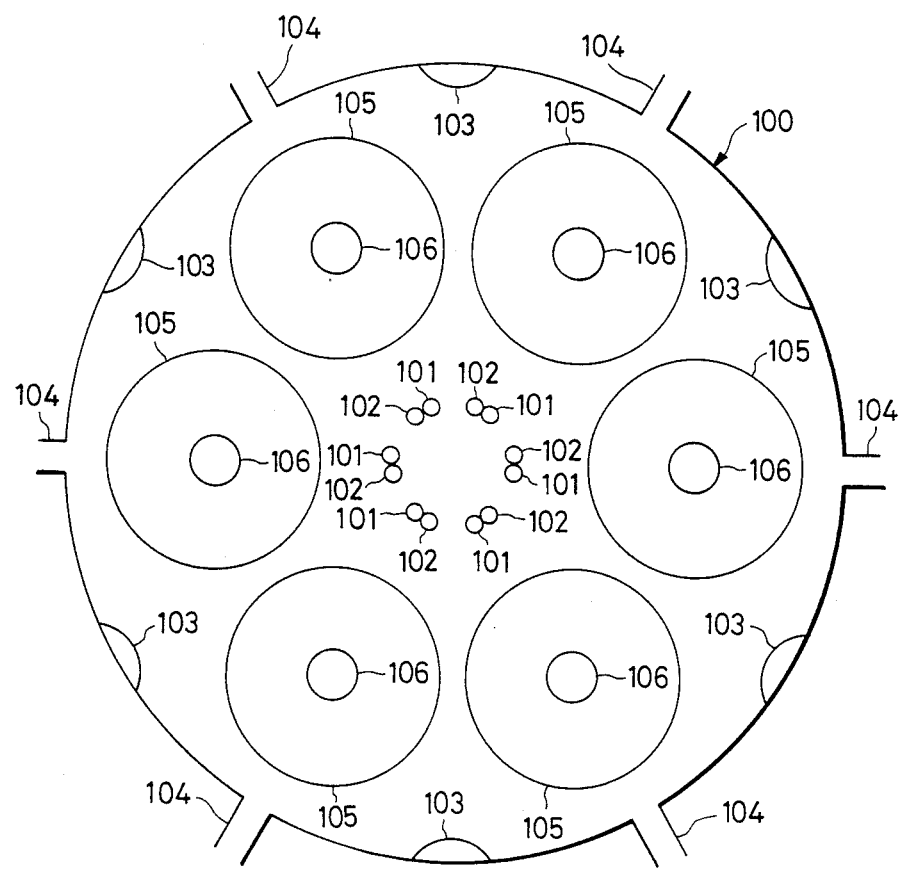
FIG. 1 is a schematic cross-sectional view of the apparatus for forming deposited films according to the present invention.
Figure 3:
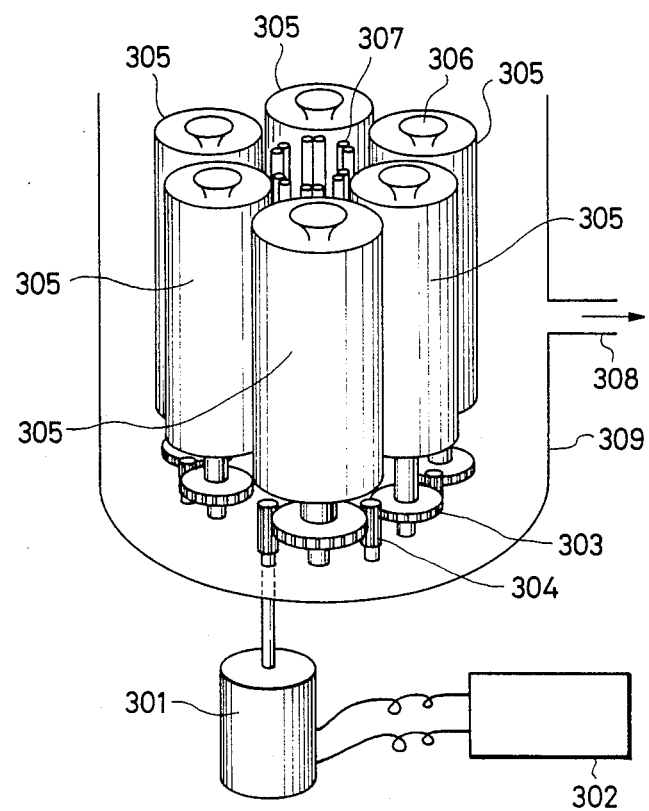
FIG. 3 is a schematic perspective diagram of the apparatus for forming deposited films according to the present invention.

FIG. 1, shows a cross-sectional view of the deposited film-forming apparatus of the invention. The deposited film-forming apparatus of the invention comprises, at the central portion of a cylindrical deposited film-forming chamber 100, a gas discharge means consisting of six pairs of a discharge pipe 102 for discharging a gaseous starting material for forming a deposited film and a discharge pipe 101 for discharging a halogen type oxidizing agent; a cylindrical support disposing member (not shown in the figure) for placing cylindrical supports 105 provided with a member 106 for transporting the cylindrical support, the cylindrical supports being placed around the gas discharge means so as to be arranged at the positions equidistant from the discharge means and surround the gas discharge means; exhaust ports 104 connected to an exhaust pump (not shown in the figure) for maintaining a predetermined internal pressure of the deposited film-forming chamber 100 and heaters 103 for heating the cylindrical supports 105, on the inner wall of the deposited film-forming chamber 100.

Figure 4:
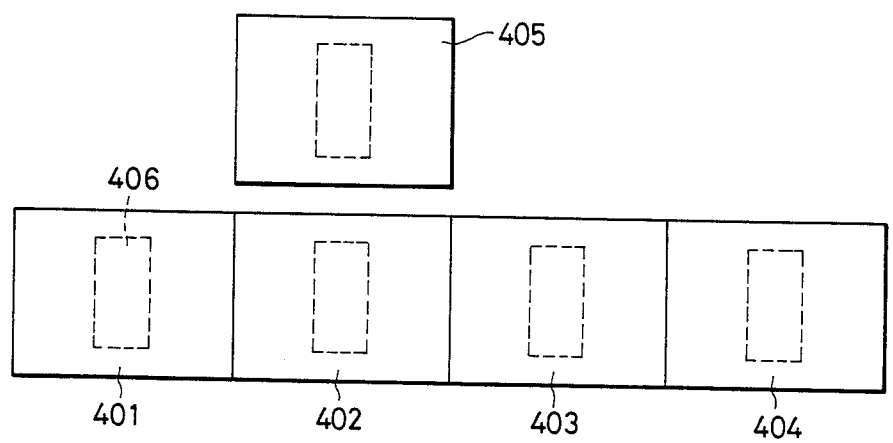
FIG. 4 is an illustrative diagram of the system for forming deposited films in which the deposited film-forming apparatus of this invention is incorporated as a component thereof.

FIG. 4 shows a schematic perspective diagram of the deposited film-forming apparatus according to the present invention. A deposited film-forming system shown in FIG. 4 (which comprises an apparatus 401 for introducing a cylindrical support and preheating the same, a deposited film-forming apparatus 402, a cooling apparatus 403, a transporting apparatus 404 and an apparatus 405 for transporting the cylindrical support to each one of the apparatus) includes the apparatus for forming deposited films according to the present invention.

The outside of the deposited film-forming chamber, a motor 301 for rotating the cylindrical supports and a controller 302 therefor are disposed so that cylindrical supports are rotated at a predetermined rotational speed through gears 304, 303 for rotating the cylindrical support within the deposited film-forming chamber, driven by the power of the motor 301.

FIG. 2A (plane view) and 2B (elevational view) show a schematic diagram of the gas discharge pipes disposed within the deposited film-forming chamber according to the present invention.

The discharge pipe 202 for discharging a gaseous starting material for forming deposited films and the pipe 201 for discharging a halogenic oxidizing agent are placed so as to be contiguous to each other. Gas discharge ports 203 are arranged on each gas discharge pipe along its longer direction. The gas discharged from the gas discharge ports of each gas discharge pipe is delivered toward the direction as shown by an arrow 204 so that the gas discharged from the gas discharge ports of one of the discharge pipes causes collisions with that discharged from the discharge ports of the other gas discharge pipe.

It becomes possible to effectively utilize the discharged gaseous starting material for forming deposited films due to the cylindrical supports being disposed around the gas discharge means as explained above. Moreover, the apparatus according to the present invention makes it possible to promote the chemical reaction between the gases and increase the degree of utilization of the starting gases by arranging the pairs of the gas discharge pipes so that the gaseous starting material for forming deposited film and the gaseous halogenic oxidizing agent discharged from the gas discharge ports thereof cause collisions therebetween.

In addition, it is also possible to uniformly form deposited films on a plurality of supports according to the present invention, this is because the supports on which the deposited film is formed are arranged around the gas discharge means at the positions equidistant thereto and each supports rotates on its axis.

Furthermore, according to the present invention, since a spontaneous chemical reaction between the starting material and the halogenic oxidizing agent is utilized, energy for promoting the reaction is not required, the construction of the apparatus for forming deposited films can be simplified and consequently the cost required to construct such apparatus becomes cheap and the maintenance and control of the apparatus i mass production is facilitated.

The present invention is described in more detail by referring to the following Examples.

EXAMPLES:

Utilizing the apparatus for forming deposited films according to the present invention, shown in FIGS. 1 to 4 as the schematic diagrams, an image forming element for electrophotography of amorphous silicon (A-Si:H) film was produced.

Figure 5:
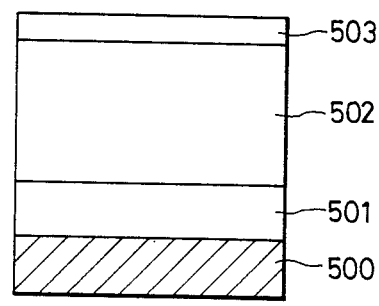
FIG. 5 is an illustrative diagram showing a structure of layers constructing the image forming material for electrophotography obtained in Example of the present invention.
Figure 6:
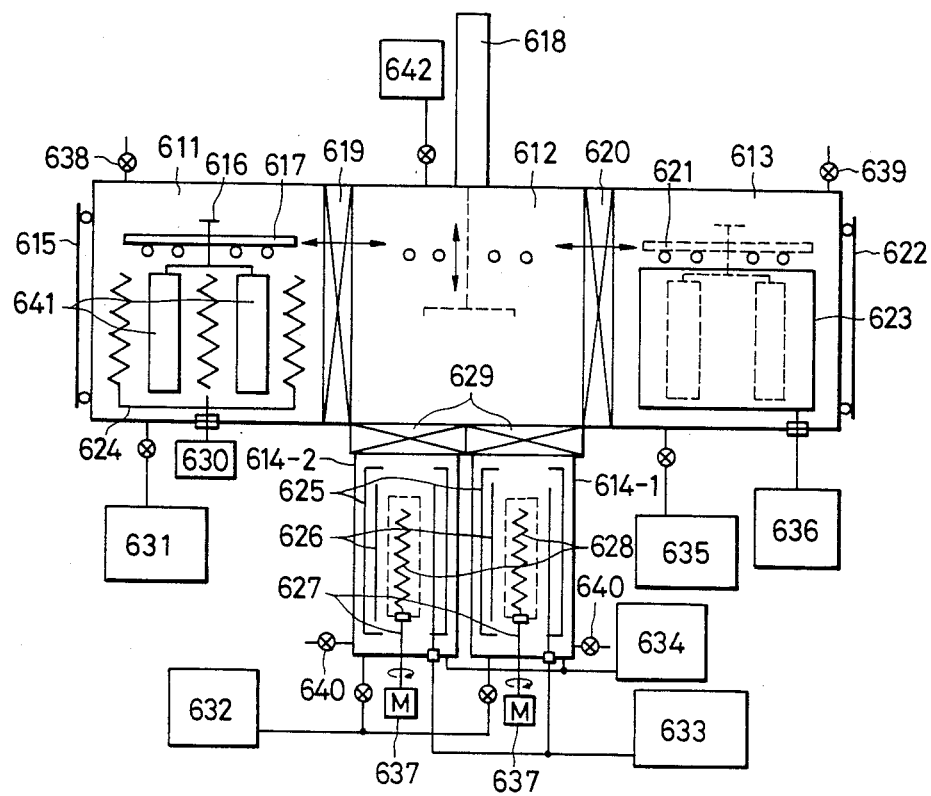
FIG. 6 is a schematic diagram illustrating a conventional vacuum film-forming apparatus according to the plasma CVD technique, capable of mass production.

The structure of layers constructing the image forming element for electrophotography is shown in FIG. 5.

That is, the image forming element for electrophotography comprises a support (Al) 500, a barrier layer 561 for preventing charge implantation from the support (P+ type A-Si:H), a photosensitive layer (A-Si:H) 502, a surface protective layer (A-SiC:H) 503.

Hereinafter, the manufacturing processes is described in more detail.

Six cylindrical supports of aluminum having a diameter of 80 mm were set up to members for transporting and introduced into a device 401 for preheating. The pressure in the preheating device was reduced to about $10^{-3}$ Torr by an exhaust pump (not shown) and argon (Ar) gas flow was introduced into the preheating device 401 to adjust the internal pressure thereof to 0.6 Torr. The switch of a heater for preheating was turned on and the heater was controlled so that the temperature of the supports was maintained at 250° C. After the temperature of the supports arrived at 250° C., Ar gas flow was stopped and the pressure in the preheating device was adjusted to $10^{-3}$ Torr Thereafter, these six cylindrical supports were transferred from the preheating device 401 to a deposited film-forming device 402 evacuated to $10^{-3}$ Torr by a cylindrical support conveying device evacuated to $10^{-3}$ Torr. The six cylindrical supports were arranged as those shown in FIG. 1. Then, a motor 301 shown in FIG. 3 was started and the number of revolution thereof was controlled so that the supports rotated at a rotation speed of 1 r.p.m. After the rotation of the supports was stabilized, the switch of the heater 103 shown in FIG. 1 was turned on and the temperature of the heaters 103 was adjusted so that the temperature of the supports was maintained at 250° C. After the temperature of the supports was stabilized, 1,000 SCCM of a mixture of silane gas ($SiH_4$), diborane gas ($B_2H_6$) and nitrogen monoxide (NO) gas ($SiH_4$:NO:$B_2H_6$=10:3:0.01) was discharged through the discharge pipe for discharging the gaseous starting material for forming deposited films, while discharging 1,000 SCCM of $F_2$ gas through the gas discharge pipe for discharging the gaseous halogenic oxidizing agent and the reaction between them was continued for 30 minutes to form a barrier layer for preventing charge implantation having a thickness of 3 μm on the Al supports. Then, the gas mixture of $SiH_4$, $B_2H_6$, NO gases was continuously replaced by $SiH_4$ gas discharged from the discharge pipe for discharging starting material, by the use of a switching device (not shown) and the reaction was continued for 180 minutes to form a photosensitive layer of 18 μm in thickness on the barrier layer for preventing charge implantation. Thereafter, the $SiH_4$ gas was continuously replaced by a mixed gas consisting of $SiH_4$ gas and $CH_4$ gas ($SiH_4$:$CH_4$=1:10) and 1,000 SCCM of the mixture was discharged. The reaction was carried out for 30 minutes to form a surface protective layer of 0.5 μm in thickness on the photosensitive layers. The layer thickness was measured with a layer thickness measuring apparatus of ALPHA STEP (manufactured by TENCOR CO.).

After the image forming element for electrophotography was deposited, the discharge of each gas was stopped, purging with Ar gas was carried out, then the internal pressure of the deposited film-forming device was adjusted to $10^{-3}$ Torr, the six supports were transferred to a cooling device 403 utilizing the device 405 for conveying supports to cool them, thereafter transferred from the cooling device 403 to a device 404 for withdrawal by the device 405 for transporting and the internal pressure of the device 404 for withdrawal was brought back to the atmospheric pressure with gradually introducing Ar gas thereto to remove the image forming element for electrophotography formed.

The image forming element for electrophotography thus deposited has a uniform thickness and characteristics sufficient for practical use as the image forming element for electrophotography. Moreover, the degree of utilization of the starting gas was found to be more than 70%.

As described above in detail, according to the present invention, the following effects can be attained'
(1) The cost of the apparatus is cheap since a lot of deposited films can be produced by only one deposited film-forming apparatus at one time and uniformly;
(2) The degree of gas utilization is high and the cost of starting gas for deposited films is cheap since the supports are arranged around the gas discharge pipes;
(3) The rate of reaction is good and a high degree of gas utilization is attained, this is because the gaseous starting material and the halogenic oxidizing agent are efficiently admixed with each other;
(4) The running cost of the apparatus is cheap since no external energy other than the energy for heating the supports is required.

We claim:
1. An apparatus for forming a deposited film by bringing a gaseous starting material for forming the deposited film into contact with a gaseous halogenic oxidizing agent having the property of oxidative action on the gaseous starting material, which comprises:

a chamber in which the deposited film is formed;

a plurality of elongated gas discharge means in the chamber, each arranged substantially equidistant from the center portion of said chamber, each of said gas discharge means including first and second gas discharge conduits, said first gas discharge conduit for discharging the gaseous starting material and said second gas discharge gas conduit for discharging the gaseous halogenic oxidizing agent;

said first and second gas discharge conduits each including a plurality of orifices for discharging their respective gases and each said first gas discharge conduit being positioned substantially adjacent and parallel to said second gas discharge conduit of the same gas discharge means, said adjacent and parallel first and second gas discharge conduits being positioned in such an arrangement so as to provide sufficient mixing of the gaseous starting material and gaseous halogenic oxidizing agent being discharged from said adjacent and parallel conduits so as to cause a chemical reaction between the two gases and effect the formation of said deposited film;

a plurality of substrate support means each positioned equidistant from the center portion of said chamber and positioned relative to at least one of the gas discharge means such that a cylindrical substrate mounted thereon is capable of receiving the deposited film formed by the interaction of the gaseous starting material and gaseous halogenic oxidizing agent discharged by said at least one of the gas discharge means; and means for imparting rotational motion to each of said substrate support means.

2. The apparatus for forming a deposited film of claim 1, wherein the orifices for discharging the gas are uniformly distributed along each gas discharge conduit.

3. The apparatus for forming a deposited film of claim 1, each of said gas discharge conduits further including first and second ends, with gas being introduced into said conduit at said first end and wherein the orifices for each gas discharging conduit are distributed such that there is a larger number of orifices adjacent said second end than the number of orifices adjacent said first end.

4. The apparatus for forming a deposited film of claim 1, each of said gas discharge conduits further including a center axis and wherein the orifices of each gas discharge conduit are positioned such that a first straight line passing through and perpendicular to the center axis of the first gas discharge conduit and through one of the orifices said first gas discharge conduit intersects a second straight line passing through and perpendicular to the center axis of the second gas discharge conduit of the same gas discharge means and through one of the orifices of said second gas discharge conduit.

5. The apparatus for forming a deposited film of claim 1, where said orifices are positioned such that said gaseous starting material and gaseous halogenic oxidizing agent directly collide with each other after being discharged.

* * * * *